United States Patent [19]
Yamazaki et al.

[11] Patent Number: 5,300,798
[45] Date of Patent: Apr. 5, 1994

[54] SEMICONDUCTOR INTEGRATED CIRCUIT DEVICE

[75] Inventors: Kouichi Yamazaki, Maebashi; Setsuo Ogura, Takasaki; Kazuyuki Kamegaki, Sawa; Kenya Yamauchi; Yukinori Kitamura, both of Takasaki; Tuyoshi Nagase, Maebashi, all of Japan

[73] Assignees: Hitachi, Ltd.; Hitachi Microcomputer System, Ltd.; Hitachi Tobu Semiconductor, Ltd.; Hitachi Communication Systems, Incorporated, Tokyo, Japan

[21] Appl. No.: 978,293

[22] Filed: Nov. 17, 1992

Related U.S. Application Data

[63] Continuation of Ser. No. 691,290, Apr. 25, 1991, abandoned.

[30] Foreign Application Priority Data

Apr. 27, 1990 [JP] Japan .................. 2-113693

[51] Int. Cl.$^5$ ............................................. H01L 27/02
[52] U.S. Cl. ............................ 257/207; 257/210; 257/211; 257/758; 257/776
[58] Field of Search ................... 357/40, 65, 71, 68; 257/758, 774, 776, 920, 921, 208, 210, 207

[56] References Cited

U.S. PATENT DOCUMENTS

| | | | |
|---|---|---|---|
| 4,606,781 | 8/1986 | Vyne | 357/65 |
| 4,716,452 | 12/1987 | Kondoh et al. | 357/40 |
| 4,839,820 | 6/1989 | Kinoshita et al. | 357/40 |
| 4,857,987 | 8/1989 | Ogura et al. | 257/758 |
| 4,864,381 | 9/1989 | Seefeldt et al. | 357/40 |
| 4,924,290 | 5/1990 | Enkaku et al. | 357/45 |
| 4,958,222 | 9/1990 | Takakura | 357/71 |

FOREIGN PATENT DOCUMENTS 1-154533 of 1989 Japan .

OTHER PUBLICATIONS

"Nikkei Electronics", No. 455 (Sep. 5, 1988), pp. 179-183, published by Nikkei-McGraw-Hill Corp. (with English Translation).
Fifteenth European Solid-State Circuit Conference, held in Sep. 1989 (ESSCIRC '89), pp. 121-124.

Primary Examiner—Rolf Hille
Assistant Examiner—Roy Potter
Attorney, Agent, or Firm—Pennie & Edmonds

[57] ABSTRACT

When a semiconductor integrated circuit device having a wiring structure of three or more layers is hierarchically considered as a collection of a plurality of functional blocks, each functional block is internally connected by wirings in the first wiring layer, in which wirings have their main extended direction prescribed to be the X-direction, and wirings in the second wiring layer, in which wirings have their main extended direction prescribed to be the Y-direction, formed over the first wiring layer. Wirings in the third wiring layer, in which wirings have their main extended direction prescribed to be the same as the wirings in the second wiring layer, formed over the second wiring layer, together with wirings in the first and second wiring layer, are used as signal wirings between functional blocks, while the wirings in the third wiring layer are used as power supply wirings for providing power supply to functional blocks. As the power supply paths to functional blocks, a plurality of power supply wirings are branched off from the power supply electrode such as a power supply pad and terminated there. The power supply electrode on the high voltage side and the power supply electrode on the low voltage side are disposed separately at opposing edge portions of the semiconductor substrate and the power supply wirings proceeding therefrom to their target functional blocks are bent in the vicinity of the edge portion of the semiconductor substrate and therefrom extended straight to the target points.

7 Claims, 5 Drawing Sheets

SEMICONDUCTOR INTEGRATED CIRCUIT DEVICE

This is a continuation of application Ser. No. 07/691,290, filed Apr. 25, 1991, now abandoned.

BACKGROUND OF THE INVENTION

The present invention relates to a multilayer structure of a semiconductor integrated circuit device, countermeasures against crosstalks between power supply wirings and signal wirings, and countermeasures against noises transmitted through power supply wirings, and, more particularly, to an art effectively applicable to a semiconductor integrated circuit device including an analog signal processing unit.

As one of the measures for achieving higher degree of circuit integration or higher packaging density of semiconductor integrated circuit devices meeting demands for miniaturization of the devices, a multilayer wiring structure is coming into much use. Basically, the multilayer wiring structure is such that it has an insulating film placed over wiring patterns formed in the layer thereunder, contact holes made through the insulating film, and wirings in the next layer placed over the same.

In analog signal processing for video tape recorders, for example, it has been general practice to use two-chip structure, i.e., an LSI for processing the C signal (color signal) and an LSI for processing the Y signal (luminance signal). An example of having the C signal processing unit and the Y signal processing unit integrated on one chip is described in "Nikkei Electronics", No. 455 (Sep. 5, 1988), pp. 179-183, published by Nikkei-McGraw-Hill Corp.

SUMMARY OF THE INVENTION

While there are increasing demands for higher degree of circuit integration and the system on chip, the inventors of the present invention found it necessary, for development of multilayer wiring structure, to consider crosstalks and the like which are caused depending on signals processed and characteristics of circuits used, as well as reduction of the wiring area.

Description of a multilayer wiring structure used in integrating a C signal processing unit and a Y signal processing unit on a single chip follows below.

When a C signal processing unit and a Y signal processing unit are integrated on one chip, the signals handled therein and required wirings increase in number. Consequently, if a two-layer wiring structure is used therefor, it becomes necessary to provide relatively large wiring areas between functional blocks to prevent formation of intersections by different wirings within one wiring layer and the chip area becomes larger accordingly. The inventors of the present invention, therefore, started studies of a three-layer wiring structure for decreasing the chip size. When wiring layers increase in number, unwanted capacitive components parasitic between vertically arranged wirings increase, leading to an increase in crosstalk between wirings. In the analog processing LSI for the video tape recorder under consideration, since handled frequencies overlap each other, or analog processing is performed on the same chip for the Y signal processing unit and C signal processing unit which handle signals of high frequencies, the crosstalk between multilayer wirings produces a great influence on the circuit operations. That is, once such crosstalk occurs, cross color is produced by a Y signal mixing with the C signal and dot crawl is produced by a C signal mixing with the Y signal, and as a result the picture quality suffers a great deterioration. If, then, an increased signal frequency is used to improve the resolution, the impedance of an unwanted capacitive component formed between vertically arranged wirings sandwiching an insulating film therebetween, becomes smaller and hence the crosstalk is intensified, and thus a high quality picture as expected becomes unobtainable. Especially because the C signal and Y signal overlap each other in frequency components, the crosstalk between these signals have a great effect.

Further, when a three-layer wiring structure in which wirings within vertically adjoining wiring layers have an intersecting relation, that is, one is extended in the X-direction while the other is extended in the Y-direction, most of the intersecting portions of the wirings come to have relatively great capacitive components determined by one layer of the interlayer insulating film interposed therebetween. This also invites a decrease in impedance of the capacitive component and an increase in crosstalk.

The crosstalk in question herein covers not only a crosstalk between signal wirings but also a crosstalk between the signal wiring and the power supply wiring. More specifically, when a power supply noise resulting from a crosstalk is transmitted to other circuits sharing in the same power supply wiring, the state of bias or the like in these circuits is varied and, hence, undesired variations are caused in the signals in the C signal processing unit and the Y signal processing unit. If the spacing between wirings is increased to reduce such a crosstalk, the chip size becomes increased and higher degree of circuit integration becomes unachievable.

The multilayer wiring structure is also applied, for example, to gate arrays and standard-cell LSIs. With the advancement of the scale of LSIs and the implementation of the analog-digital combined arrangements, there is an increasing demand for development of ASIC (Application Specific IC) technology, for example, CAD (Computer Aided Design) technology, capable of developing such LSI of larger scale in a short period of time.

Figure 2:
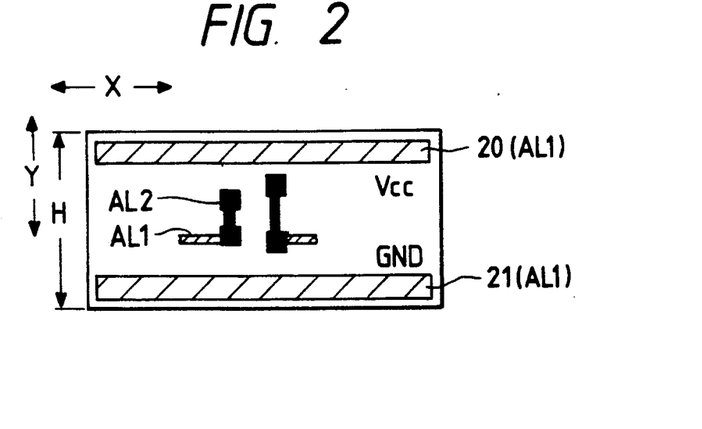
FIG. 2 is a structural drawing showing an example of power supply wiring within a functional block.

An example of a semiconductor integrated circuit including combined analog and digital circuits designed with gate arrays using CMOS as basic cells is described, for example, in Japanese Laid-open Patent Publication No. 1-154533 laid-open on Jun. 16, 1989. This reference deals with an art in which both the power supply wiring and the ground wiring are separated from each of the digital circuit and the analog circuit. More specifically, each pair of power supply wiring and ground wiring extended from one edge side of the chip, in parallel, along each column of cells are formed in a wiring region and connected with a plurality of functional blocks. Since the power supply wirings and ground wirings with a relatively large width are formed in the wiring regions located between columns of cells, the area of the wiring region can hardly be reduced and hence the chip area increases. In FIG. 2 of this reference, there is disclosed power supply wirings arranged in parallel with the column of cells of a CMOS gate array and extended over the column of cells, the power supply wiring being commonly connected to all the cells.

A general object of the present invention is to provide a semiconductor integrated circuit having a multilayer wiring structure advantageous in terms of reliability in operations and small chip size.

Another object of the present invention is to provide a semiconductor integrated circuit in which crosstalks between wirings are reduced.

A further object of the present invention is to provide a semiconductor integrated circuit in which accuracy in analog signal processing operations is enhanced using a multilayer wiring structure.

A still further object of the present invention is to provide a semiconductor integrated circuit having a multilayer wiring structure contributing to decrease in crosstalk without sacrificing the small size of the chip, or achieving a decrease in the chip area.

The above and other objects and novel features of the present invention will become apparent from the following description read in connection with the accompanying drawings.

Of the aspects of the invention disclosed herein, representative ones will be briefly described as follows.

In a semiconductor integrated circuit of a wiring structure of three layers or more, wirings in each layer are prescribed to have the same extended directions and wirings in predetermined two layers adjoining in the vertical direction are adapted to have a common extended direction, X-direction or Y-direction. In such a multilayer wiring structure, a wiring in one of the two wiring layers having the wirings common in their main extended directions and a wiring in another wiring layer adjoining to the aforesaid two layers are arranged to intersect each other. The wirings at the intersecting point have the interlayer insulating films for two layers and, hence, the parasitic capacitance between the intersecting wirings becomes small.

More specifically, a semiconductor integrated circuit device having a wiring structure of three layers or more is hierarchically considered as a collection of a plurality of functional blocks, each functional block is suitably connected by wirings in the first wiring layer, in which wirings have their main extended direction prescribed to be the X-direction, and wirings in the second wiring layer, in which wirings have their main extended direction prescribed to be the Y-direction. Then, wirings in the third wiring layer, in which wirings have their main extended direction prescribed to be the same as the wirings in the second wiring layer, formed over the second wiring layer, together with the wirings in the first and second wiring layer, are used as signal wirings between functional blocks. Since the main wiring directions in the second and third wiring layers are the same, it becomes so that those wirings having intersecting relation within the wiring channel between functional blocks are the wirings in the first and third wiring layers. Thus, at the intersecting point of the wirings, there are present interlayer insulating films for two layers interposed between the wirings, and the parasitic capacitance between the intersecting wirings becomes small. Further, it becomes easier to provide a shield wiring connected with the potential of a power source in the second wiring layer. Also, by passing a wiring of the third wiring layer through a position not overlapping a wiring of the second wiring layer, the capacitance parasitic between the wirings can be reduced.

To further reduce the parasitic capacitance formed, when a wiring in the third wiring layer is passed over a functional block, between the wiring in the second wiring layer within the functional block and the wiring in the third wiring layer passing over the functional block, the lengths of the sides in the Y-direction of the rectangles, each of which defines the region of each functional block, are made relatively short and equal to each other, so that, even when the wiring in the second wiring layer within the functional block and the wiring in the third wiring layer passing over the functional block are arranged in parallel close to each other, the length of the wirings in parallel may become short.

In order to reduce the capacitance parasitic between a signal wiring and a power supply wiring, the arrangement in which main extended directions of the wirings in the second wiring layer and third wiring layer are made the same is applicable. In this case, the wirings in the third wiring layer are utilized as the power supply wirings.

In order to prevent a crosstalk formed in the power supply wirings, or a power supply noise, from affecting specific functional blocks, the power supply path to functional blocks is divided into a plurality of power supply wirings starting and terminated at a power supply electrode such as a power supply pad.

When the wirings in the third layer are thus utilized also as the power supply wirings, with the power supply wirings on both the high voltage side and the low voltage side formed in one layer, the third wiring layer, and signal wirings are also mixed in the wirings in the third wiring layer, in order to increase the degree of freedom in making layout of wirings to thereby facilitate the wiring designing and to reduce useless leading around of the power supply wirings, it is proper to use such a wiring pattern in which the power supply electrode on the high voltage side and the power supply electrode on the low voltage side are separately disposed at the opposing edge portions of the semiconductor substrate and each power supply wiring is bent in the vicinity of the edge portion and therefrom extended straight to the target position.

Considering the need for characteristic analysis and trouble analysis of the circuit in the semiconductor integrated circuit device of the multilayer wiring structure using such an instrument as an electron beam tester, a conductive lead portion is formed in the topmost wiring layer, which lead portion is electrically connected with an objective wiring thereunder and electrically separated from other wirings in the low layer or a wiring shielded by the wiring in the topmost layer may be easily observed.

Further, in the semiconductor integrated circuit device having the multilayer wiring structure, in order to make it possible, after the wiring process of the semiconductor integrated circuit device has been generally finished, to set up the programmed state of a program circuit, which is adjustable into different circuit states by changing conductive-nonconductive states of program links, with the overall operating characteristics of the semiconductor integrated circuit device taken into consideration, while the semiconductor integrated circuit device is being operated, it is proper to form the program links by a wiring in the topmost wiring layer.

According to the above described means, it is arranged such that the main extended directions of the wirings in specific vertically adjacent two layers are made the same and, when the wirings in the higher layer of the wirings in the adjoining two layers are used as wirings between functional blocks capable of passing over functional blocks, the side of the rectangular functional blocks in parallel with the main extended direction of the wirings between functional blocks unified to a relatively short length, whereby capacitive components parasitic between the wirings in the separate layers are reduced and hence the crosstalk between the wirings are reduced.

When such multilayer wiring structure is applied to a semiconductor integrated circuit device including an analog signal processing unit, since the parasitic capacitance between wirings is already reduced, the impedance of such parasitic capacitance is prevented from being lowered even if the signal frequency is increased, and therefore, an expected improvement in the siganl processing accuracy can be achieved.

The power supply path to the functional blocks are divided into branch power supply wirings starting and terminated at the source of power, whereby a power source noise is prevented from being undesirably transmitted to and adversely affecting specific functional blocks, through the impedance common to functional blocks in the power supply system.

As the power supply wirings to target functional blocks, such a pattern is used such that it is bent in the vicinity of the edge portion of the semiconductor substrate and therefrom extended straight to the target positions, whereby the degree of freedom in making layout not only of the power supply wirings but also of the signal wirings included in the same wiring layer is increased, the wiring design is facilitated, and useless leading around of the power supply wirings is reduced. This and the arrangement to use the wirings in the upper layer of the adjoining two layers for the wirings between functional blocks capable of passing over functional blocks as described above enables the chip area to be reduced.

Besides, the above described means as well as the means to provide in the topmost layer a conductive lead portion connected with a target wiring in the relatively low layer, and the means to form the program links of a program circuit with a wiring in the topmost wiring layer are able to individually provide useful means for a multilayer wiring structure in a semiconductor integrated circuit device.

The structure of the present invention will now be described as related to the drawings. Throughout the drawings describing the embodiment, parts having like function are denoted by like reference numerals and repeated explanation of the same is omitted.

DESCRIPTION OF THE PREFERRED EMBODIMENTS

Figure 1:
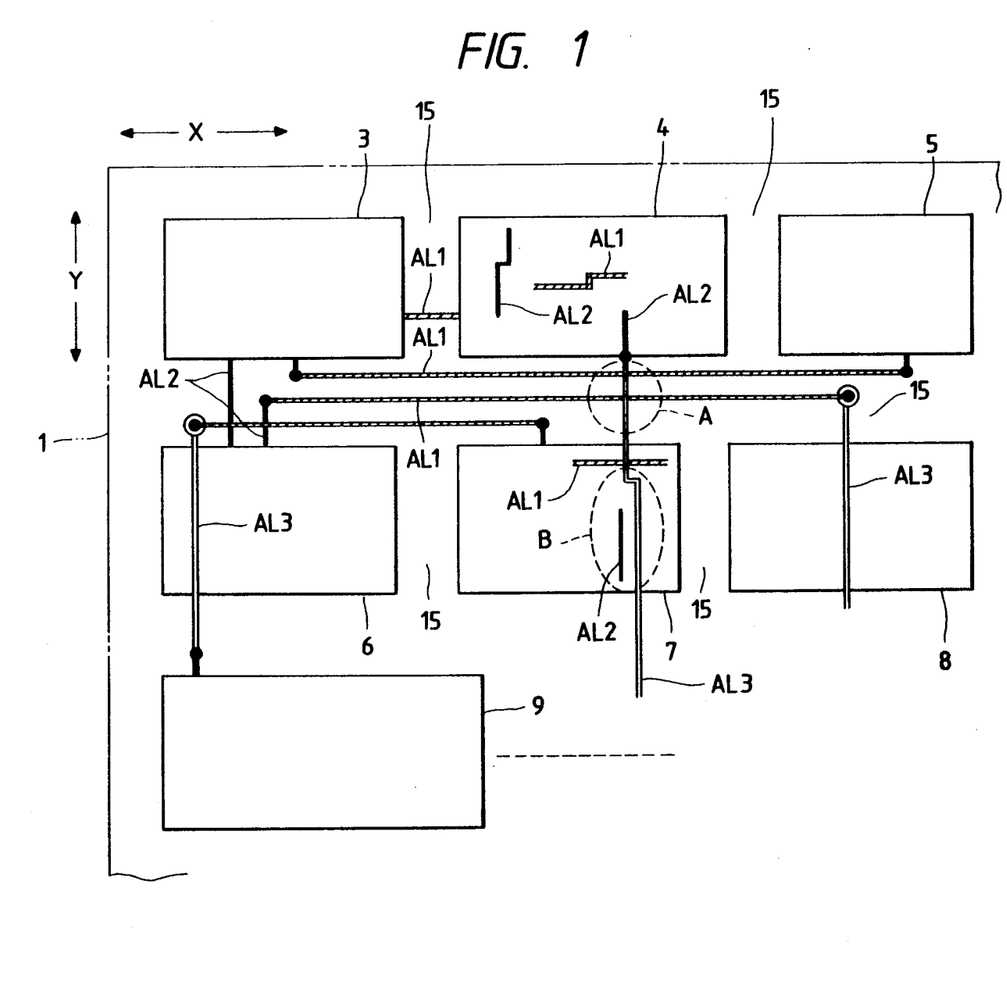
FIG. 1 is a structural drawing of signal wirings between blocks in a semiconductor integrated circuit device according to an embodiment of the present invention.

FIG. 1 shows an example of signal wiring structure between blocks of a semiconductor integrated circuit device according to an embodiment of the present invention. Description of the structure of power supply wiring will be given later.

The semiconductor integrated circuit device shown in FIG. 1 is formed on one semiconductor substrate 1 of single crystalline silicon or the like by a commonly known art for fabricating semiconductor integrated circuit of such a type as MOS (metal oxide semiconductor) tupe and bipolar type, but the device is not limited in its particular circuit configuration or device structure.

The semiconductor integrated circuit device is designed with a hierarchical method using the CAD tool, for example, to attain necessary functions as a whole of the LSI by collection of a plurality of functional blocks. In FIG. 1, some functional blocks 3-9 are shown as representatives of such functional blocks.

The way according to what functional levels the functions of individual blocks are to be divided is not particularly limited. It is appropriately determined according to such factors as the number of divisions or according to cell block library. The functional blocks 3-9 are arranged by means of, but not limited to, the CAD tool.

The semiconductor integrated circuit shown in FIG. 1 has a three-layer structure of metal (aluminum) wirings, wherein wirings denoted by AL1 are first-layer aluminum wirings whose main extended direction is prescribed to be the X-direction, wirings denoted by AL2 are second-layer aluminum wirings whose main extended direction is prescribed to be the Y-direction, formed over the first-layer aluminum wirings AL1 with an interlayer insulating film, not shown, interposed therebetween, and wirings denoted by AL3 are third-layer aluminum wirings whose main extended direction is prescribed to be the Y-direction the same as the second-layer aluminum wirings AL2, formed over the second-layer aluminum wirings AL2 with an interlayer insulating film, not shown, interposed therebetween. Although the main extended direction of each aluminum wiring is prescribed to be the X-direction or Y-direction, the wirings may be bent in the direction perpendicular to the main direction as shown in FIG. 1, provided that such bending is within the range of a predetermined number of wiring lattices.

Internal connections of each of the functional blocks 3-9 are achieved through the first-layer aluminum wiring AL1 and the second-layer aluminum wiring AL2, whereby a circuit having a predetermined function can be structured.

The wiring between functional blocks adjoining each other in the X-direction is conducted by the first-layer aluminum wiring AL1 and the wiring between functional blocks adjoining each other in the Y-direction is conducted by the second-layer aluminum wiring AL2. The wiring between functional blocks not adjoining each other in the X-direction is conducted by the first-layer aluminum wiring AL1 and the second-layer aluminum wiring AL2. Therefore, between the functional blocks, there are provided wiring channels 15 in both X-direction and Y-direction for inter-block wirings to be conducted by the first-layer aluminum wirings AL1 and the second-layer aluminum wirings AL2. The wiring channels 15 are set up on, but not limited to, the field oxide film formed on the principal plane of a semiconductor substrate, not shown.

The wiring between functional blocks not adjoining each other in the Y-direction is conducted by the third-layer aluminum wiring AL3. Therefore, it is not necessary to specifically secure a wiring channel dedicated to the third-layer aluminum wirings AL3 for connections between functional blocks. The third-layer aluminum wiring AL3 is capable of passing even along the layer over a functional block.

In summary, the first-layer aluminum wirings AL1 are extended in the X-direction and the second-layer aluminum wirings AL2 and the third-layer aluminum wirings AL3 are extended in the Y-direction. The connections between functional blocks are conducted by the aluminum wirings AL1 in the first-layer and the aluminum wirings AL2 in the second-layer over the wiring channels 15 and by the third-layer aluminum wirings AL3 passing along the layer over the wiring channel 15 and the functional block, while the wirings within functional blocks are conducted by the aluminum wirings AL1 in the first-layer and the aluminum wirings AL2 in the second layer.

At a portion where aluminum wirings in different layers intersect at right angles in the above described three-layer aluminum wiring structure, for example, at the portion A, the first-layer aluminum wiring AL1 and the third-layer aluminum wiring AL3 intersect and there are interposed therebetween the interlayer insulating films for two layers, the first layer and the second layer. Hence, the parasitic capacitive component formed between the wirings in that position is reduced to a half of the parasitic capacitance formed between vertically adjoining aluminum wirings.

Further, in the intersecting position A, a shield wiring can be inserted between the two wirings by making use of a second-layer aluminum wiring AL2. This shield wiring is connected with power on the high or low side, and thereby a crosstalk between the upper and lower wirings is reduced. This leads to an increased degree of freedom in making the wiring pattern and hence the degree of freedom in the design of the device is increased.

Although the capacitive components parasitic on the third-layer aluminum wiring AL3 include that parasitic between the same and the second-layer aluminum wiring AL2, since both the wirings have their main extended directions of wirings in the same direction (Y-direction), there is produced no intersecting portion therebetween and, further, one of the wirings can be offset easily to one side so that they will not be closely positioned overlapping each other. Therefore, when it is possible that the aluminum wirings AL2 and AL3 overlap each other as shown in the portion B, it is easy to avoid their overlapping by slightly bending, for example, the third-layer aluminum wiring AL3, and thereby, the capacitive component parasitic between the third-layer aluminum wiring AL3 and the second-layer aluminum wiring AL2 can be easily reduced.

Figure 3:
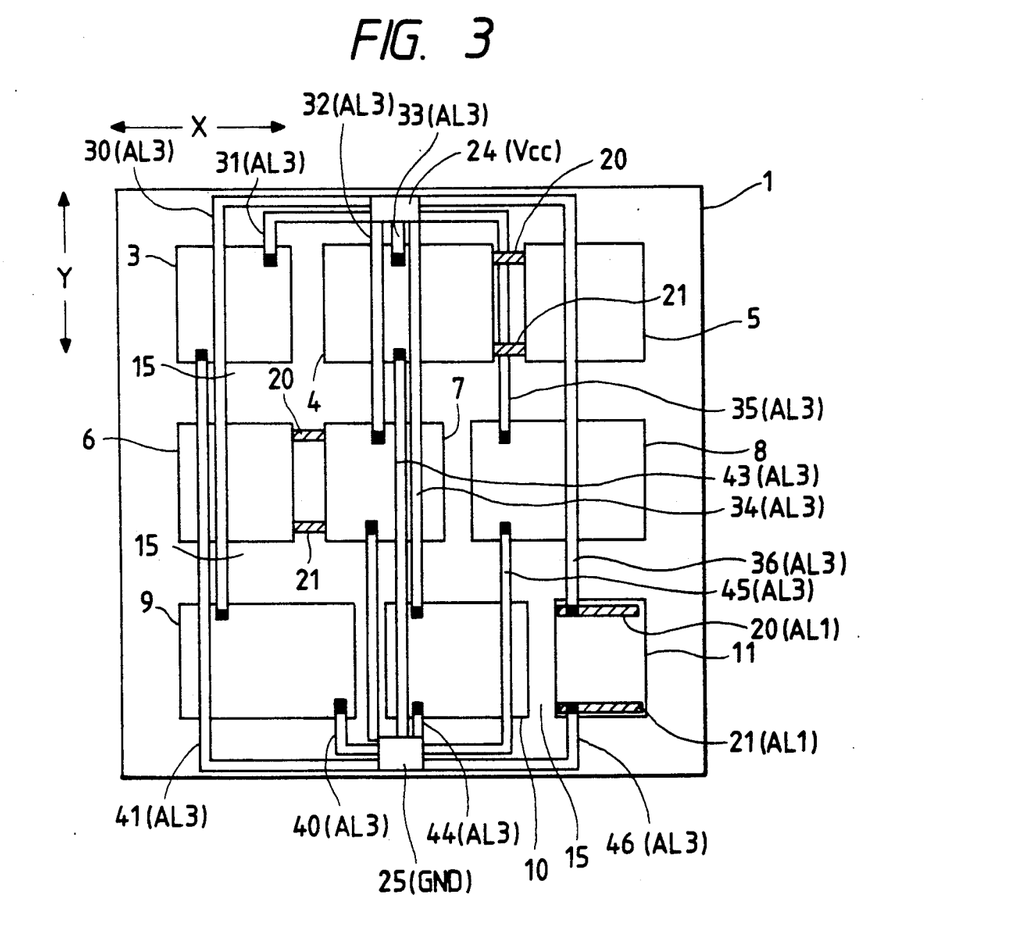
FIG. 3 is a structural drawing showing power supply wirings to functional blocks in a semiconductor integrated circuit device according to an embodiment of the present invention.

The functional blocks 3-9 are, as shown in FIG. 1, linearly arranged, in substance, in the X-direction. The length H of the side in the Y-direction of the rectangle defining each functional block is unified for all the functional blocks and the length H is set to a relatively small value as compared with the length of the side of the semiconductor substrate 1. Meanwhile, the length W in the X-direction of the same is set optionally depending on the scale of the circuit of the functional block. Accordingly, even in the case where the third-layer aluminum wiring AL3 and the second-layer aluminum wiring AL2 must be arranged in parallel relatively closely as shown in the portion B, the maximum length of the portions of the wirings AL2 and AL3 to be arranged in parallel can be made relatively short. Also in this regard, the capacitive component parasitic between the second-layer aluminum wiring AL2 and the third-layer aluminum wiring AL3 is reduced. The wiring channel 15 substantially running in the X-direction is extended, as shown in FIG. 1 and FIG. 3, but not limited so, from one side of the chip to the opposite side with a predetermined width given.

As a result of the above described reduction in the undesirable capacitive component parasitic between wirings in the aluminum three-layer wiring structure as shown in FIG. 1, crosstalks between signal wirings are suppressed and it is thereby attained to prevent malfunction from occurring and to suppress declining of the processing accuracy within each functional block. For example, when a digital signal is transmitted through the signal line, waveform shaping or level shaping is performed in a circuit such as an input buffer on the input side, but in the case where a variation due to a crosstalk is extremely great, there is a possibility of reversal of the output of the buffer leading to a malfunction. However, according to the three-layer wiring structure of the present embodiment, such a great amount of crosstalk leading to a level reversal can be prevented from occurring. Further, when an analog signal is transmitted through the signal wiring, even if a variation in the signal due to a crosstalk should be introduced as it is into the analog processing, the deterioration in the signal processing accuracy can be suppressed because the crosstalk itself is suppressed. Further, if the signal frequency is increased to improve the analog signal processing accuracy, the impedance of the parasitic capacitance between the signal wirings tends to decrease, but since the capacitance value itself of the parasitic capacity is already lowered, the decrease in the impedance of the parasitic capacity on account of the increase in the frequency is suppressed accordingly, and therefore, the accuracy of the analog signal processing accuracy can be improved as expected.

FIG. 2 shows an example of power supply wiring structure within a functional block. The power supply wiring within each functional block of the semiconductor integrated circuit 1 is formed by the first-layer aluminum wiring AL1 and the second-layer aluminum wiring AL2. Especially for receiving the power supply from outside the block, a high-voltage power supply wiring 20 such as $V_{cc}$ is formed by the first-layer aluminum wiring AL1 at the upper edge portion of the functional block and a low-voltage power supply wiring 21 such as GND is formed by the first-layer aluminum wiring AL1 at the lower edge portion of the functional block. Each of the wirings 20 and 21 is extended in the X-direction from one side of the functional block to the opposite side. Within each functional block, the wiring 20 is formed, but not limited so, on the side of a pad 24 while the wiring 21 is formed on the side of a pad 25, FIG. 3 shows an example of structure of power supply wirings for functional blocks of semiconductor integrated circuit according to an embodiment of the present invention.

A high-voltage power supply pad 24 ($V_{cc}$) is arranged at the portion in the center of the upper side of the semiconductor substrate 1 and a low-voltage power supply pad 25 (GND) is arranged at the portion in the center of the lower side of the same. Power supply from the pads 24 ($V_{cc}$) and 25 (GND) to each of the functional blocks 3-11 is conducted by the third-layer aluminum wirings AL3 for both the high-voltage side $V_{cc}$ and the low-voltage side GND. Also in this power supply wiring formed by the third-layer aluminum wiring AL3, there is produced a crosstalk between the same and the signal wiring in the layer below the same or a power supply noise is produced depending on the power consumption in the internal circuit, especially in its output circuit. In the present embodiment, to prevent such disturbance or noise from widely affecting the operation of the device, the power supply path is divided, according to circuit characteristics of each of the functional blocks 3-11 and particulars of the process performed therein, into a plurality of branch power supply wirings 30-36 starting and terminated at the power supply pad 24 on the high-voltage side, and, similarly, the power supply path is divided into a plurality of branch wirings 40-46 on the low-voltage side starting and terminated at the power supply pad 25 on the low-voltage side.

The power supply wirings 30-36 and 40-46 are each connected with the power supply wirings 20 and 21 included in each of the functional blocks 3-11 at target positions. The connection of the power supply wirings 20 and 21 formed by the first-layer aluminum wirings AL1 with the power supply wirings formed by the third-layer aluminum wirings AL3 is conducted by connecting predetermined aluminum wirings AL1 in the first-layer and predetermined aluminum wirings AL2 in the second-layer by means of contact holes, not shown, and by connecting the aluminum wirings AL2 in the second-layer and predetermined aluminum wirings AL3 in the third-layer by means of contact holes, not shown. In the case of the functional blocks capable of having common power supply systems from the power supply pads 24 and 25, such as the functional blocks 4 and 5, or the functional blocks 6 and 7, the power supply wirings 20 and 21 can be extended so that the functional blocks are interconnected thereby.

The wiring pattern of various power supply wirings formed by the third-layer aluminum wirings AL3 which also includes signal wirings has such a pattern in which the wirings branching off from the power supply pads 24 and 25 first proceed in parallel with the upper edge or the lower edge of the semiconductor substrate 1 (the X-direction) up to halfway points (predetermined positions), and there, they turn a right angle and proceed to their target functional blocks straightly (in the Y-direction). In the idle areas of the power supply wirings 30-36 and 40-46, the signal wirings formed by the third-layer aluminum wirings AL3 as shown in FIG. 1 are provided. Incidentally, various power supply wirings within the functional blocks and those formed by the third-layer aluminum wirings AL3 are designed, for example, by means of the CAD tool. While the power supply wirings 30-36 and 40-46 for supplying power from the pads 24 and 25 to each of the functional blocks 3-11 are formed using the third-layer aluminum wirings AL3, the power supply wirings are arranged to proceed over the functional blocks in the Y-direction.

According to the above described arrangement of the power supply wirings, the power supply wirings 30-36 and 40-46 do not make a bend in the central portion of the semiconductor substrate 1 (the area in which the functional blocks are arranged), and therefore, the designing of wiring becomes easy and useless leading around of the power supply wirings is reduced, and further, the degree of freedom in making the layout of the third-layer aluminum wirings AL3, which also include signal wirings, is increased. More specifically, since the power supply pad 24 ($V_{cc}$) on the high voltage side and the power supply pad 25 (GND) on the low voltage side are provided on the opposing sides of the chip and the power supply wirings proceeding from each of the pads to each of the functional blocks are formed by the third-layer aluminum wirings capable of passing over the functional blocks, the degree of freedom in making the layout of the power supply wirings can be increased. Further, since the power supply wirings for both high and low voltages together with the signal wirings are formed by the third-layer aluminum wirings AL3, the miniaturization of the chip can further be promoted. Furthermore, since the power supply wirings extended in the Y-direction from the outermost circumferential portion of the semiconductor substrate to each of the functional blocks 3-11 are formed only by the third-layer aluminum wirings AL3, not using the second-layer aluminum wirings AL2, they need not pass through the area of the wiring channels 15, and therefore, the power supply wirings can be arranged to be extended over the functional blocks. Thereby, the degree of freedom in making the layout of the power supply wirings can be improved and, in addition, it is made possible to reduce the area of the wiring channel region, and hence to reduce the chip size. Further, the degree of freedom in making the layout of the power supply wirings and signal wirings by means of CAD can be improved and the development period can be shortened. Further, the internal wirings of each of the functional blocks 3-11 can be designed most suitably and, thereby, the area of each block can be reduced.

Figure 4:
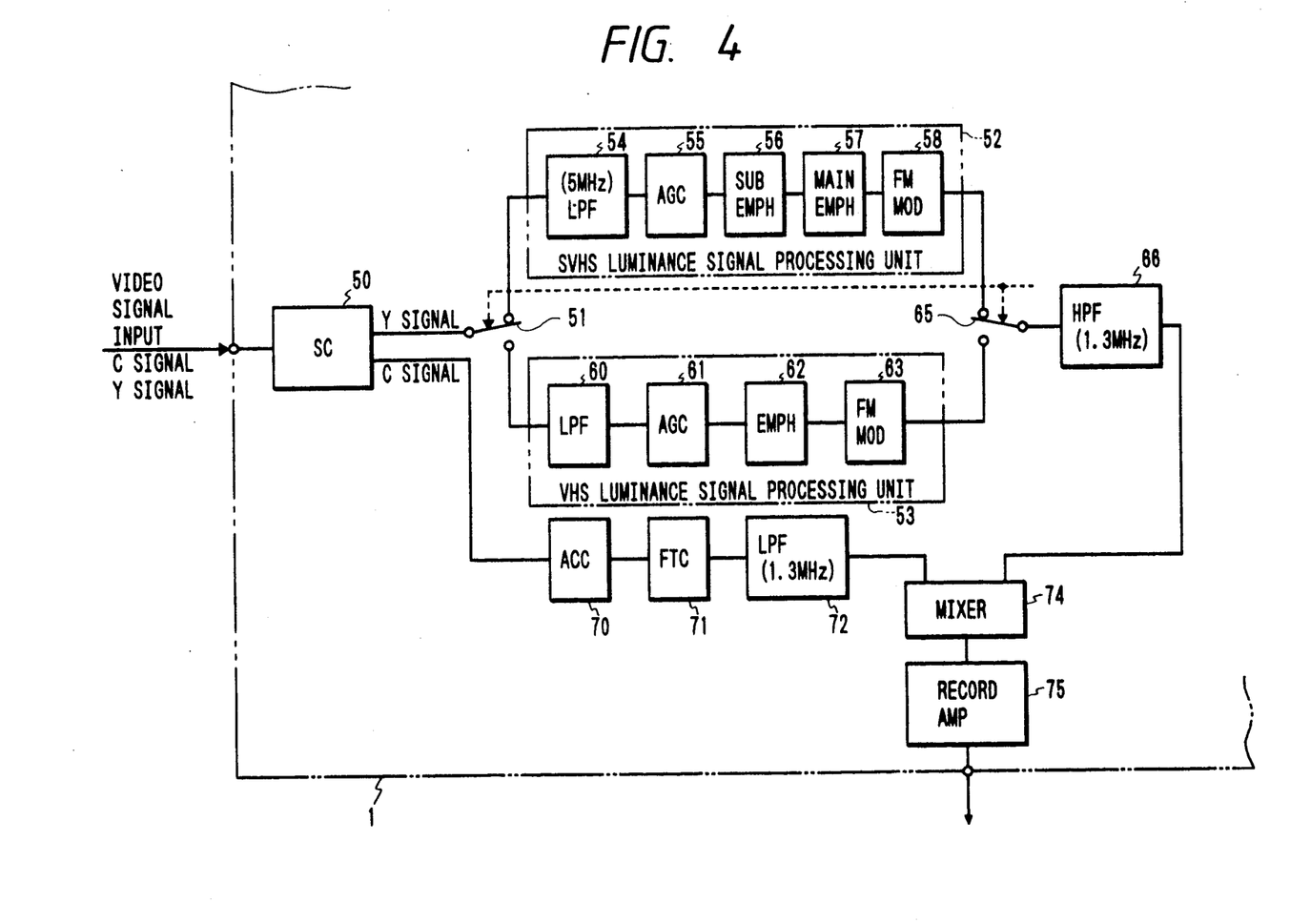
FIG. 4 is a functional block diagram of a writing system in an LSI for processing a VTR signal applicable to the semiconductor integrated circuit device according to an embodiment of the present invention.

FIG. 4 is a circuit block diagram of the semiconductor integrated circuit device of the above described multilayer wiring structure as applied to a signal processing LSI for a VTR (video tape recorder), in which, a circuit block diagram of a writing system in particular is shown.

The VTR signal processing LSI is that having a C signal processing unit and a Y signal processing unit arranged on one chip, in which the Y signal processing unit includes both a VHS processing unit and an SVHS processing unit. The video input to the VTR signal processing LSI has the Y signal as a luminance signal and the C signal as a color signal mixed therein, and it is separated into the Y signal and the C signal in an separator circuit (SC) 50. Although it is not limitative, the Y signal has frequencies of 0-5 MHz and the C signal has frequencies of 3.58±0.5 MHz.

The Y signal is selectively supplied, through an input selector 51, to the luminance signal processing unit 52 for SVHS or to the luminance signal processing unit 53 for VHS. In the luminance signal processing unit 52 for SVHS, the Y signal is supplied, through a low-pass filter (LPF) for 5 MHz, to an AGC (auto gain control) circuit 55 to be adjusted for gain, and the high-frequency component of the signal adjusted for gain is emphasized in a sub-emphasis circuit (SUB EMPH) 56 and a main emphasis circuit (MAIN EMPH) 57, and thereafter, the signal is FM-modulated in an FM modulation circuit (FM MOD) 58, in which the FM-modulated signal is given frequencies, for example, of 0–15 MHz. On the other hand, the luminance signal processing unit 53 for VHS has a low-pass filter (LPF) 60 for 3 MHz, an AGC circuit 61, an emphasis circuit (EMPH) 62, and an FM modulation circuit (FM MOD) 63, in which an FM-modulated signal having frequencies, for example, of 0–8 MHz is obtained. The output of the luminance signal processing unit 52 for SVHS or the luminance signal processing unit 53 for VHS is selected by an output selector 65 and supplied to a high-pass filter (HPF) 66, in which frequency components lower than, for example, 1.3 MHz are cut off and the transmitted signal is supplied to the subsequent stage.

The C signal is adjusted for gain in an ACC (auto color-level control) circuit 70, translated to the lower-frequency side in a frequency translation circuit (FTC) 71, and supplied to a low-pass filter (LPF) 72. In the low-pass filter (LPF) 72, frequency components higher than 1.3 MHz are cut off.

Both the output signal frequencies thus separated from the video input through described luminance signal processing and color signal processing and output therefrom are combined in a mixer 74, and a recording amplifier 75 is driven by the combined signal so that the picture is recorded with a record head, not shown.

Since either of the luminance signal processing unit 52 for SVHS and the luminance signal processing unit 53 for VHS is selectively operated, such circuits as the AGC circuits and the FM modulation circuits which are separately included in each of the processing units can be arranged to be shared by both of the processing units. Incidentally, as to circuit blocks other than those for writing systems, there is disclosure, for example, in U.S. application Ser. No. 538,448 filed June 15, 1990, content of which is incorporated herein by reference. Further, these circuit blocks are constructed of one or more functional blocks as described above and registered in a cell block library (layout library). As to designing of such functional blocks, there is description, for example, in Fifteenth European Solid-state Circuit Conference, held in September 1989 (ESSCIRC '89), pp. 121–124. This paper is also incorporated herein by reference.

When such a multiplayer wiring structure as described in FIG. 1 to FIG. 3 is applied to a signal processing LSI for VTR executing both luminance signal processing and color signal processing on one chip as shown in FIG. 4, since the capacitive components parasitic between multilayered wirings of signal wirings and power supply wirings are reduced, cross color, dot crawl, or similar interference caused by crosstalk is reduced and deterioration in the quality of picture can be prevented even if signals of relatively high frequency are processed. Further, even if the impedance tends to reduce as the signal frequency is increased for the sake of analog signal processing, the crosstalk can be minimized because the plastic capacitance itself is already reduced. As a result, an expected improvement in resolution can be attained by increasing the signal frequency.

Further, as to the structure of power supply wirings for functional blocks, by sorting power supply wirings into circuits blocks largely differing from other circuit blocks in particulars of processing, frequencies of processed signals, or the like, as shown in FIG. 3, that is, for example, by assigning the FM modulation circuit 58 for the luminance signal processing unit 52 for SVHS to the functional block 3 in FIG. 3 and by assigning the LPF 54 and the AGC circuit 55 in the preceding stage thereof to the functional blocks 4 and 5, a crosstalk in the power supply system or a power source noise is prevented from causing mutual interference between functional blocks by way of their common impedance. Also in this regard, the signal processing accuracy can be improved.

When a luminance signal processing unit and a color signal processing unit are integrated on one chip, the number of signal wirings increases and the chip area tends to increase accordingly, but by employing the multilayer structure described with reference to FIG. 1 to FIG. 3, crosstalks are not produced so much and wiring can be conducted with a high degree of freedom even if no dedicated wiring channels for the third-layer aluminum wirings AL3 are provided in the areas between functional blocks, and thus, the increase in the chip area can be minimized.

Figure 5A:
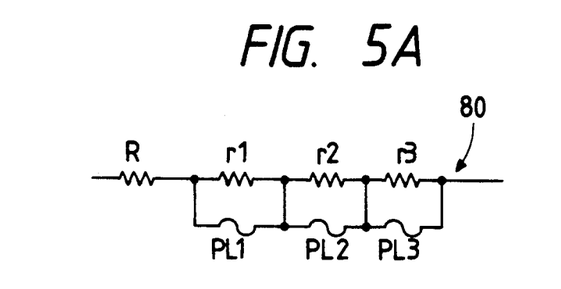
FIG. 5A, FIG. 5B, and FIG. 5C are an equivalent circuit diagram, a device sectional structural diagram, and a device plan view of an example trimming circuit included in a semiconductor integrated circuit device.
Figure 5B:
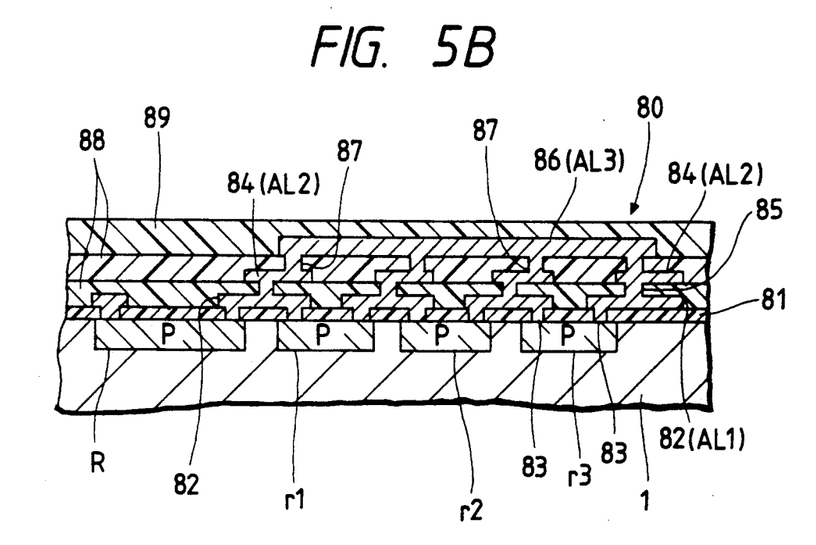
Figure 5C:
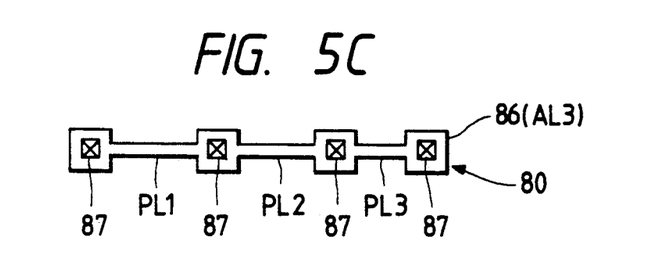

FIG. 5A to FIG. 5C are an equivalent circuit diagram, a device sectional view, and a device plan view showing an example of a trimming circuit included in a semiconductor integrated circuit device having a three-layer wiring structure, A trimming circuit 80 shown in these diagrams is an example of a program circuit assuming different circuit states according to conductive and nonconductive states of program links. As shown in the equivalent circuit diagram of FIG. 5A, a resistor R and three resistors r1–r3 are connected in series, and the resistors r1–r3 are connected in parallel with program links PL1–PL3, respectively. The combined resistance of the described arrangement can be adjusted to be set to seven different values by having each of the program links left as it is or cut off. In this trimming circuit 80, the resistors r1–r3 are provided by the so-called diffused resistor formed by injecting a p-type impurity into an n-type semiconductor substrate 1. The resistor R and r1–r3 are connected in series with one another by way of conductive layer segments 82 formed by the first-layer aluminum wirings AL1 on a silicon oxide film 81 and contact holes 83 made therein. Each of the conductive layer segments 82 is connected with each of conductive layer segments 84 formed by the second-layer aluminum wirings AL2 in one-to-one correspondence by way of through holes 85, and each of the conductive layer segments 40, in turn, is connected with one conductive layer 86 formed by the third-layer aluminum wiring AL3 by way of through holes 87. The conductive layer 86 corresponds to the program links PL1–PL3 shown in FIG. 5A. In FIG. 5B, reference numeral 88 denotes an interlayer insulating film and 89 denotes a surface protecting film.

By forming the program links PL1–PL3 of the trimming circuit 80 by the third-layer aluminum wiring AL3 in the topmost layer, it becomes possible to adjust and set the trimming circuit 80 with its relation to the overall operating characteristics of the semiconductor integrated circuit taken into consideration while it is being operated after the wiring process has been completed. In such an analog signal processing LSI as that in the present embodiment, there are relatively large number of portions for which adjustments and setting are required such as gain adjustments in the amplifier, adjustments of the frequency characteristic of the filter, the feed back capacitance of the integrating circuit, and adjustments of the input resistor value. Since states of these portions affect the overall signal processing characteristics of the device with some relationship thereto, the capability of adjustments and setting of the trimming circuit and the like, while the semiconductor integrated circuit is being operated, with its relationship to the overall operating characteristics taken into consideration, facilitates the adjustment work and promotes equalization of the operating characteristics.

Figure 6A:
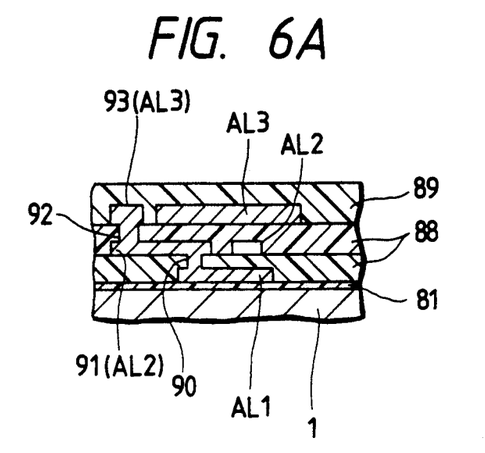
FIG. 6A and FIG. 6B are a sectional view and a plan view of a multilayer wiring structure adapted for a non-destructive test.
Figure 6B:
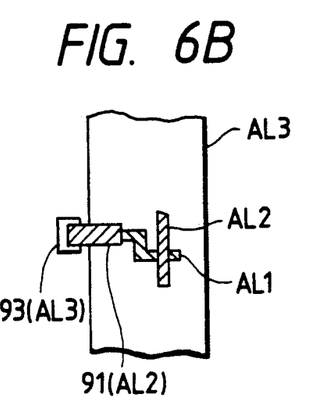

FIG. 6A and FIG. 6B show, in a sectional view and a plan view of the device, an example of wiring structure in a semiconductor integrated circuit device of a multilayer wiring structure adapted for conducting circuit characteristic analysis and trouble analysis of the circuit using an electron beam tester or the like.

Figure 7A:
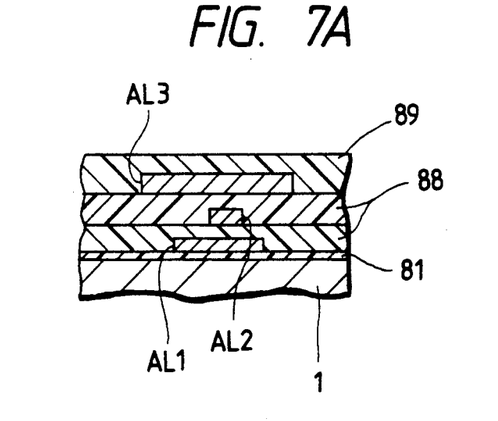
FIG. 7A and FIG. 7B are a sectional view and a plan view of a multilayer wiring structure not adapted for a non-destructive test.
Figure 7B:
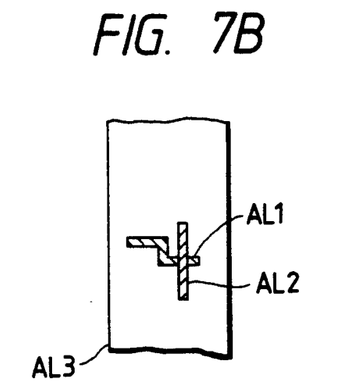

Let it be supposed, when attention paid to a portion of the semiconductor integrated circuit device, that the semiconductor substrate 1 has a lamination of layers successively deposited thereon of the silicon oxide film 81, first-layer aluminum wiring AL1, interlayer insulating film 88, second-layer aluminum wiring AL2, interlayer insulating film 88, third-layer aluminum wiring AL3, and the surface protecting film 89. Then, the attempt to observe the signal in the first-layer aluminum wiring AL1 with the device held in the state as shown in FIG. 7A and FIG. 7B will fail because the third-layer aluminum wiring AL3 thereabove is in the way. In such position, there may be provided, as shown in FIG. 6A and FIG. 6B, a conductive lead portion 91 formed of a second-layer aluminum wiring AL2 connected with the target first-layer aluminum wiring AL1 through a contact hole 90 and a conductive lead portion 93 formed of a third-layer aluminum wiring AL3 connected with the conductive lead portion 91 through a contact hole 92, with each of the conductive lead portions 91 and 93 electrically separated form other wirings. Then, by allowing an electron beam to impinge on the conductive lead portion 93 in the topmost layer, it becomes possible to observe a wiring in a rather lower layer or a wiring shielded behind another wiring in the layer thereabove. Thus, also for a semiconductor integrated circuit of a multilayer wiring structure, characteristic analysis and trouble analysis of the circuit can be easily conducted using an electron beam tester or the like.

While my invention has been described as related to particular embodiments, it is to be understood that the present invention is not limited to the specific embodiments but various changes and modifications may be made therein without departing from the spirit of the invention.

For example, the number of divisions of the functional blocks in the multilayer wiring structure shown in FIG. 1 and FIG. 3 is not limited to that shown therein but may be changed suitably.

In the structure shown in FIG. 3, power supply wirings to functional blocks located in the vicinity of the power supply pad may be provided by some first-layer aluminum wirings AL1 provided that the same do not interfere with other first-layer aluminum wirings AL1.

In the structure shown in FIG. 3, the number of the power supply pad on each side of $V_{cc}$ and GND is not limited to one but may be increased to more than one. In such a case, it will be proper to utilize each separate power supply pad for each group of functional blocks, whose sharing in the same power supply wiring with another group is undesirable. The power source pad is not limited to the type subjected to wire bonding but may be an electrode of a wireless bonding type such as a bump electrode.

Although an example of a resistor trimming circuit was described in FIG. 5A to FIG. 5C, the program circuit is not limited to the same but applicable to program circuits for capacitor selection or logic selection.

The conductive lead portion is also applicable to a case where the second-layer aluminum wiring is lead to the topmost layer.

Although the three-layer structure of aluminum wirings was described by way of example in each of the embodiments, the number of layers may be other than three and the wiring is not limited to that of aluminum but may be that of high-melting-point metal such as tungsten and molybdenum or even of polycrystalline silicon or silicide. Incidentally, the aluminum wiring, as generally understood, includes impurities such as copper and silicon so that formation of hillocks, its reaction with the silicon substrate, or occurrence of electromigration may be eliminated to improve reliability.

Although, in the foregoing, my invention was described as to its application to a VTR signal processing LSI having thereon a combination of the C signal processing unit and the Y signal processing unit, which had been the field of utilization in its technical background, the present invention is not limited to that but it can be applied to a wide variety of semiconductor integrated circuits such as analog signal progressing LSI and digital-analog combined semiconductor integrated circuit, and, further, to general digital LSI such as microcomputer and memory.

Advantages obtained from representative elements of the invention disclosed herein will be briefly described below.

Since the main extended directions of wirings in specific two layers vertically adjoining each other are set to be the same, wirings in such adjoining wiring layers are arranged in parallel, not intersecting each other, while wirings in different layers arranged to intersect each other are provided with interlayer insulating films for two layers interposed therebetween. Accordingly, capacitive components parasitic between wirings can be reduced.

Further, since there is present another wiring layer between the intersecting wirings of different layers, a shield wiring to be supplied with power supply potential or the like can be easily interposed therebetween.

When the wiring in the upper layer of the wirings in vertically adjoining layers is arranged to be an interblock wiring capable of passing over another functional block, by having the length of the side, in parallel with the main extended direction of the interblock wiring, of the rectangle defining the region of the functional block unified to a relatively small value, the extended length in parallel with each other of the wirings in the adjoining layers can be made short, so that the parasitic capacitance at this portion can be made still smaller.

The above described effects provide advantages to reduce crosstalks between wirings.

When the described multilayer wiring structure is applied to a semiconductor integrated circuit including an analog signal processing unit, even if the signal frequency is increased, the resultant decrease of the impedance of the parasitic capacitance between wirings is suppressed because the parasitic capacitance itself is already reduced, and therefore, an advantage is obtained that an expected improvement in signal processing accuracy can be attained.

By having the power supply wiring for functional blocks divided into branches and terminated at the source of power, an advantage is obtained that a power supply noise is prevented from being undesirably transmitted to specific functional blocks through common impedance in the power supply system between the functional blocks.

By employing, as the power supply wirings to the target functional blocks, such a pattern that is first bent in the vicinity of the edge of the semiconductor substrate and thereafter straightly extended to the target positions, the power supply wirings do not bend at the central portion of the semiconductor substrate, whereby designing for wiring is made easier and useless leading around of power supply wirings is reduced and, further, the degree of freedom can be increased in designing wiring layout in the wiring layer in which signal wirings are mixed with the power supply wirings.

Further, by arranging the main extended directions of the power supply wirings to functional blocks and the adjoining wirings in the layer thereunder to be the same, the capacitive components parasitic between the power supply wirings and the signal wirings can be reduced, and this arrangement also contributes to the reduction of the crosstalk.

By the adoption of the above described power supply wiring structure, since power supply wirings on both high-voltage and low-voltage sides as well as signal wirings can be formed within the wiring layer capable of passing along the layer over the functional blocks, further miniaturization of the chip can be achieved.

By adopting the above described multilayer wiring structure for each of the signal wirings and power supply wirings, an advantage is obtained that the crosstalk can be decreased with chip size kept small, or rather than that, making the chip area smaller.

In a semiconductor integrated circuit of a multilayer wiring structure, by having a conductive lead portion provided in the topmost wiring layer such that the conductive lead portion is electrically connected with a target wiring in the layer thereunder but electrically isolated from other wirings in the topmost layer, a wiring located in the relatively low layer or a wiring in such a position as shielded behind the wiring over the same becomes easily observed when characteristic analysis or trouble analysis of the circuit is conducted using an electron beam tester or the like.

Further, by forming, with a wiring in the topmost wiring layer, program links of a program circuit to be adjusted into different circuit states by changing conductive-nonconductive states of the program links, it becomes possible, after the wiring process of a semiconductor integrated circuit device has been generally finished, to conduct programming of the program circuit, while the device is being operated, with the overall operating characteristics of the semiconductor integrated circuit device taken into consideration, and thereby, the adjustment work with the program circuit can be facilitated and equalization of operating characteristics of the semiconductor integrated circuit devices can be attained.

What is claimed is:

1. A semiconductor device comprising:
    a plurality of tetragonal functional blocks arranged in a X-direction and a Y-direction on a semiconductor substrate, forming a matrix of said tetragonal functional blocks, wherein said Y-direction is perpendicular to said X-direction, and wherein the widths, as measured along said Y-direction, of said tetragonal functional blocks are substantially equal;
    wiring channels each extending in X-direction and being disposed between said functional blocks;
    first wirings comprising a first layer of metal and extending mainly in said X-direction, said first wirings being located in said blocks and said wiring channels;
    second wirings comprising a second layer of metal formed over said first layer of metal and extending mainly in said Y-direction, said second wirings being located in said blocks and said wiring channels;
    third wiring comprising a third layer of metal; and
    a first electrode formed of said third layer of metal, said third wirings extending from said first electrode to each of said blocks to supply a first potential to each of said blocks, said third wirings extending over said blocks and wiring channels mainly in said Y-direction,
        wherein said blocks arranged in said X-direction are also electrically connected by said first and second wirings located on said wiring channels, and
        wherein at least one adjacent pair or blocks in said Y-direction is electrically connected by said second wirings.

2. A semiconductor device according to claim 1, further comprising;
    a first insulating film formed between said first layer of metal and said second layer of metal; and
    a second insulating film formed between said second layer of metal and said third layer of metal.

3. A semiconductor device according to claim 2, wherein said third wirings electrically connect at least one pair of blocks not adjoining each other in the Y-direction.

4. A semiconductor device according to claim 3, wherein a pair of adjoining blocks in the X-direction are connected by only said first wirings.

5. A semiconductor device according to claim 2 wherein said metal comprises aluminum.

6. A semiconductor device according to claim 1, further comprising:
    fourth wirings comprising said third layer of metal; and
    a second electrode formed of said third layer of metal, said fourth wirings extending from said second electrode to each of said blocks in order to supply a second potential which is different from said first potential to each of said blocks, and said fourth wirings extending over said blocks and wiring channels mainly in said Y-direction.

7. A semiconductor device according to claim 6, further comprising:
    fifth and sixth wirings comprising said first layer of metal and extending in said X-direction in said blocks, and each of said fifth wirings is connected to said first electrode via at least one of said third wirings to supply said first potential to said blocks and each of said sixth wirings is connected to said second electrode via at least one of said fourth wirings to supply said second potential to said blocks.

* * * * *